United States Patent
Morishima et al.

(10) Patent No.: US 11,604,225 B2
(45) Date of Patent: Mar. 14, 2023

(54) METHOD FOR ESTIMATING STATE OF CHARGE, LIQUID REDUCTION AMOUNT OF ELECTROLYTE SOLUTION OF VALVE REGULATED LEAD-ACID BATTERY, AND DEVICE FOR MONITORING VALVE REGULATED LEAD-ACID

(71) Applicant: GS Yuasa International Ltd., Kyoto (JP)

(72) Inventors: Shoya Morishima, Shizuoka (JP); Yuki Nakanishi, Shizuoka (JP)

(73) Assignee: GS Yuasa International Ltd., Kyoto (JP)

( * ) Notice: Subject to any disclaimer, the term of this patent is extended or adjusted under 35 U.S.C. 154(b) by 164 days.

(21) Appl. No.: 17/130,431

(22) Filed: Dec. 22, 2020

(65) Prior Publication Data
US 2021/0190869 A1    Jun. 24, 2021

(30) Foreign Application Priority Data
Dec. 23, 2019  (JP) .............. JP2019-231191

(51) Int. Cl.
*H01M 10/48*  (2006.01)
*G01R 31/379*  (2019.01)
(Continued)

(52) U.S. Cl.
CPC ............ *G01R 31/379* (2019.01); *B60L 58/15* (2019.02); *H01M 10/484* (2013.01); *B60L 2200/22* (2013.01); *G01R 31/3835* (2019.01)

(58) Field of Classification Search
CPC ........... B60L 2200/22; B60L 2240/547; B60L 2250/16; B60L 58/15; G01R 31/379; G01R 31/3835; H01M 10/121; H01M 10/48; H01M 10/484; H01M 10/486; Y02E 60/10; Y02T 10/70

See application file for complete search history.

(56) References Cited

U.S. PATENT DOCUMENTS

2010/0213946 A1*  8/2010  Kirchev .............. G01R 31/392
                                                    324/427

FOREIGN PATENT DOCUMENTS

| JP | 8-222279 A | 8/1996 |
| JP | 9-211090 A | 8/1997 |

(Continued)

OTHER PUBLICATIONS

Machine Translation WO2019082766A1 (Year: 2019).*

*Primary Examiner* — Victoria H Lynch
(74) *Attorney, Agent, or Firm* — Rankin, Hill & Clark LLP

(57) ABSTRACT

A method for estimating a state of charge of a valve regulated lead-acid battery includes; an overcharge amount identification step of identifying an overcharge amount when the lead-acid battery is overcharged after an arbitrary reference time; an open circuit voltage acquisition step of acquiring an open circuit voltage of the lead-acid battery after the reference time; and a state-of-charge estimation step of estimating a state of charge of the lead-acid battery based on the acquired open circuit voltage and a correlation between an open circuit voltage and state of charge in which a rate of change of the state of charge with respect to the open circuit voltage is smaller as the overcharge amount from the reference time until an acquisition time of the open circuit voltage is larger.

7 Claims, 6 Drawing Sheets

(51) Int. Cl.
*B60L 58/15* (2019.01)
*G01R 31/3835* (2019.01)

(56) References Cited

FOREIGN PATENT DOCUMENTS

| | | | |
|---|---|---|---|
| JP | 2014-105995 A | 6/2014 | |
| JP | 2017-210182 A | 11/2017 | |
| JP | 2018-169281 A | 11/2018 | |
| JP | 2019-45155 A | 3/2019 | |
| WO | WO-2019082766 A1 * | 5/2019 | ......... G11C 11/4097 |

* cited by examiner

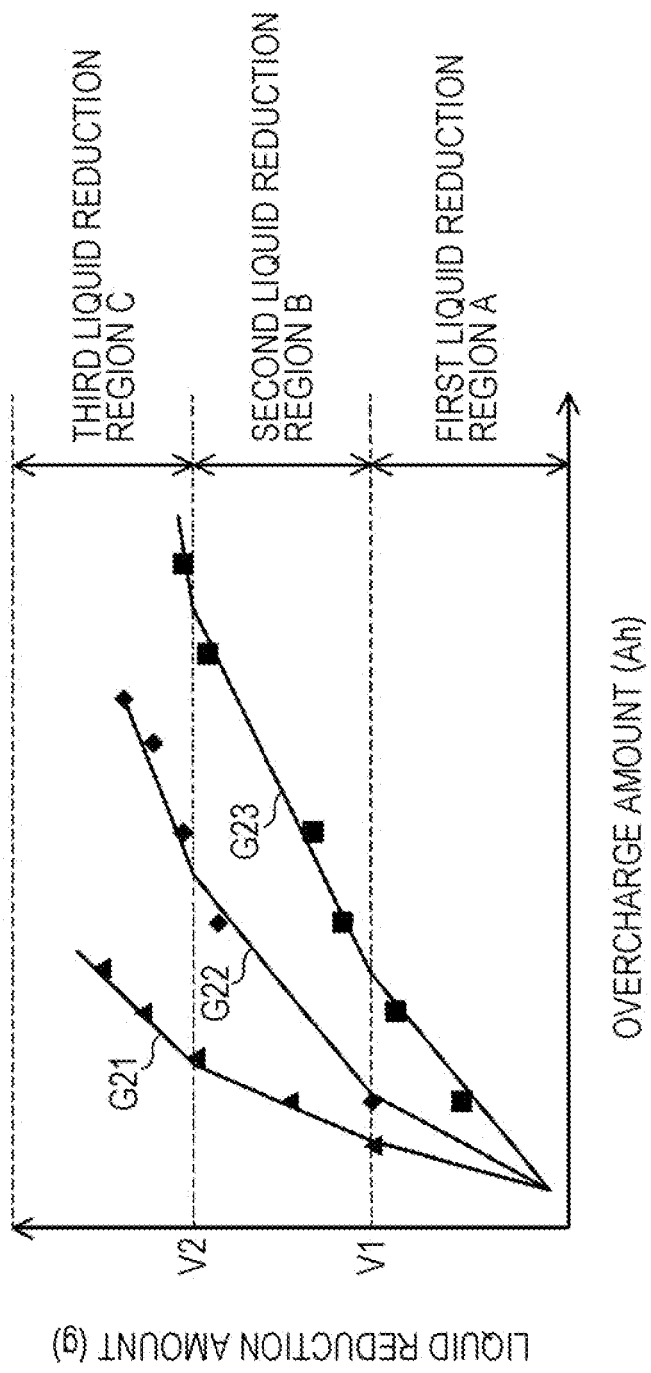

METHOD FOR ESTIMATING STATE OF CHARGE, LIQUID REDUCTION AMOUNT OF ELECTROLYTE SOLUTION OF VALVE REGULATED LEAD-ACID BATTERY, AND DEVICE FOR MONITORING VALVE REGULATED LEAD-ACID

CROSS-REFERENCE TO RELATED APPLICATIONS

This application claims the benefit of Japanese patent application No. 2019-231191 filed on Dec. 23, 2019, which is incorporated by reference.

FIELD

The technique disclosed in the present specification relates to a method for estimating a state of charge of a valve regulated lead-acid battery.

BACKGROUND

Conventionally, there is a method of measuring an open circuit voltage (OCV) of a secondary battery and estimating a state of charge (SOC) of the secondary battery based on the measured open circuit voltage (see, for example, JP 2018-169281 A and JP 2019-45155 A). For example, in a flooded-type lead-acid battery among secondary batteries, a sulfuric acid concentration of an electrolyte solution, which is a reactant, changes due to charging and discharging, and the state of charge of the flooded-type lead-acid battery changes accompanying the change in the sulfuric acid concentration. A correlation is established between the sulfuric acid concentration of the electrolyte solution and the open circuit voltage of the flooded-type lead-acid battery. Thus, it is possible to estimate the state of charge of the flooded-type lead-acid battery based on a measurement result of the open circuit voltage of the flooded-type lead-acid battery.

As one of lead-acid batteries, a valve regulated lead-acid battery (sealed lead-acid battery) is known. Unlike the flooded-type lead-acid battery, valve-regulated lead-acid batteries have a high degree of freedom in installation posture because the internal electrolyte solution does not easily flow and the amount of electrolyte solution is relatively small. Further, maintenance is easy because inspection of liquid level and refilling of liquid are not required, and it is used as a power source for uninterruptible power supplies, communication base stations, motorcycles, and the like for example.

In the conventional method for estimating the state of charge of the secondary battery described above, among lead-acid batteries, flooded-type lead-acid batteries are mainly targeted, and valve-regulated lead-acid batteries are not targeted and have not been thoroughly studied. In recent years, there has been an increasing demand for highly accurate estimation of the state of charge also of the valve-regulated lead-acid batteries. The valve regulated lead-acid battery absorbs gas generated from the inside during use by an electrode plate, and thus the electrolyte solution is less likely to be reduced as compared with the flooded-type lead-acid battery. However, because the valve regulated lead-acid battery has a small amount of electrolyte solution, even if a liquid reduction amount of the electrolyte solution (reduced amount of water contained in the electrolyte solution) is small, there is a large effect on the sulfuric acid concentration of the electrolyte solution in the housing. Thus, for example, if the state of charge is estimated simply based on the measurement result of the open circuit voltage as in the conventional method for estimating the state of charge of the secondary battery, estimation accuracy of the state of charge will be gradually deteriorated in the process of using the battery. Accordingly, the present inventors have studied advanced estimation of the state of charge for the valve regulated lead-acid battery regardless of the period of use, and estimation of the liquid reduction amount of the electrolyte solution and the sulfuric acid concentration.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present specification discloses a technology capable of at least one of accurately estimating a state of charge of a valve regulated lead-acid battery or estimating a liquid reduction amount of an electrolyte solution or a sulfuric acid concentration of a valve regulated lead-acid battery.

A method for estimating a state of charge of a valve regulated lead-acid battery according to an aspect of the present invention includes: an overcharge amount identification step of identifying an overcharge amount when the lead-acid battery is overcharged after an arbitrary reference time; an open circuit voltage acquisition step of acquiring an open circuit voltage of the lead-acid battery after the reference time; and a state-of-charge estimation step of estimating a state of charge of the lead-acid battery based on the acquired open circuit voltage and a correlation between an open circuit voltage and state of charge in which a rate of change of the state of charge with respect to the open circuit voltage is smaller as the overcharge amount from the reference time until an acquisition time of the open circuit voltage is larger.

A monitoring device for a valve regulated lead-acid battery according to another aspect of the present invention includes: an overcharge amount identification unit that identifies an overcharge amount when the lead-acid battery is overcharged after an arbitrary reference time; an open circuit voltage acquisition unit that acquires an open circuit voltage of the lead-acid battery after the reference time; and a state-of-charge estimation unit that estimates a state of charge of the lead-acid battery based on the acquired open circuit voltage and a correlation between an open circuit voltage and state of charge in which a rate of change of the state of charge with respect to the open circuit voltage is smaller as the overcharge amount from the reference time until an acquisition time of the open circuit voltage is larger.

A method for estimating a liquid reduction amount of an electrolyte solution of a valve regulated lead-acid battery according to still another aspect of the present invention, includes: an overcharge amount identification step of identifying an overcharge amount when the lead-acid battery is overcharged; and a liquid reduction amount estimation step of estimating the liquid reduction amount of the electrolyte solution based on the overcharge amount.

A method for estimating a sulfuric acid concentration of an electrolyte solution of a valve regulated lead-acid battery according to still another aspect of the present invention, includes: an overcharge amount identification step of identifying an overcharge amount when the lead-acid battery is overcharged; and a sulfuric acid concentration estimation step of estimating a sulfuric acid concentration of the electrolyte solution based on the overcharge amount.

BRIEF DESCRIPTION OF DRAWINGS

The foregoing and other features of the present invention will become apparent from the following description and drawings of an illustrative embodiment of the invention in which:

FIG. 6 is a graph showing a correlation between an overcharge amount and a liquid reduction amount.

DESCRIPTION OF EMBODIMENTS

Figure 1:
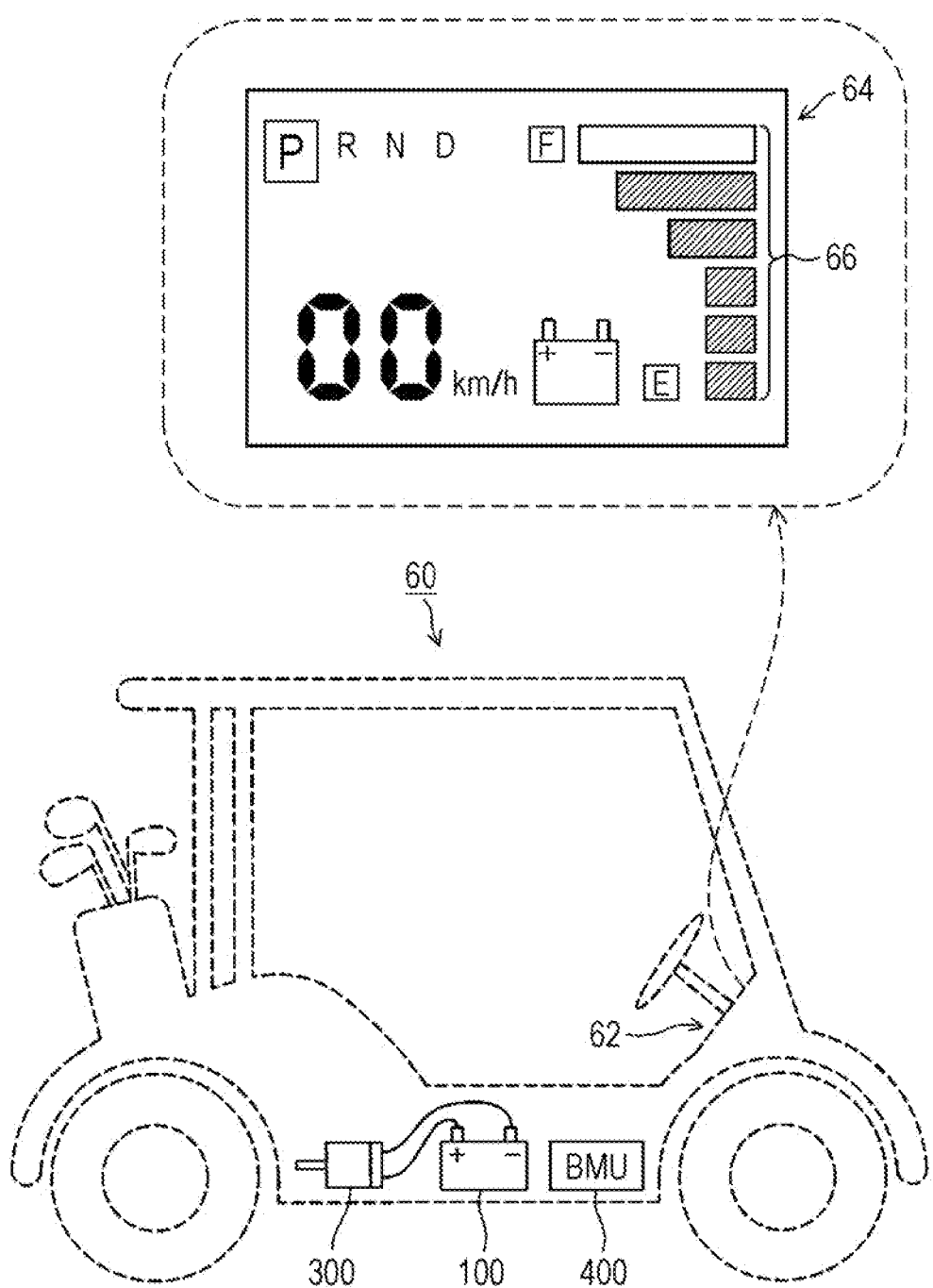
FIG. 1 is an explanatory diagram schematically showing a configuration of a golf cart 60 according to a present embodiment.

The technology disclosed in the present specification can be implemented as the following modes.

(1) A method for estimating a state of charge of a valve regulated lead-acid battery according to an aspect of the invention includes an overcharge amount identification step of identifying an overcharge amount when the lead-acid battery is overcharged after an arbitrary reference time, an open circuit voltage acquisition step of acquiring an open circuit voltage of the lead-acid battery after the reference time, and a state-of-charge estimation step of estimating a state of charge of the lead-acid battery based on the acquired open circuit voltage and a correlation between an open circuit voltage and state of charge in which a rate of change of the state of charge with respect to the open circuit voltage is smaller as the overcharge amount from the reference time until an acquisition time of the open circuit voltage is larger.

In the lead-acid battery, when the sulfuric acid concentration of the electrolyte solution fluctuates due to liquid reduction in the electrolyte solution, an open circuit voltage (hereinafter, also referred to as "OCV")-state of charge (hereinafter, also referred to as "SOC") correlation (rate of change of SOC with respect to OCV) that has to be used for estimating the state of charge of the lead-acid battery differs accompanying the fluctuation of the sulfuric acid concentration. In the conventional configuration, even if the OCV can be acquired accurately, the SOC of the lead-acid battery is estimated using a common OCV-SOC correlation regardless of the liquid reduction amount of the electrolyte solution, and thus there have been cases where the SOC could not be accurately estimated.

Through repeated extensive studies, the present inventors have newly found that in the valve regulated lead-acid battery, the liquid reduction amount of the electrolyte solution (sulfuric acid concentration in the electrolyte solution) can be estimated from an overcharge amount. That is, in the valve regulated lead-acid battery, unlike the flooded-type lead-acid battery, a main factor of liquid reduction in the electrolyte solution is liquid reduction by electrolysis of water. Further, this electrolysis of water occurs as a side reaction of charging reaction and becomes main reaction when the lead-acid battery is overcharged, and this overcharge amount is mainly used for electrolysis of water. This means that a correlation is established between the overcharge amount and the liquid reduction amount of the electrolyte solution due to electrolysis of water. From these facts, in the valve regulated lead-acid battery, it is possible to estimate the liquid reduction amount of the electrolyte solution and moreover the sulfuric acid concentration of the electrolyte solution from the overcharge amount. Then, the SOC of the lead-acid battery can be measured accurately using the OCV-SOC correlation with the rate of change according to the acquired liquid reduction amount of the electrolyte solution (fluctuation amount of the sulfuric acid concentration of the electrolyte solution). In the present method for estimating the state of charge of the valve regulated lead-acid battery, the SOC of the lead-acid battery is estimated based on the OCV-SOC correlation in which a rate of change of the SOC with respect to the OCV is smaller as the overcharge amount from a predetermined reference time until an acquisition time of the open circuit voltage is larger, and the acquired OCV. Thus, it is possible to suppress decrease in estimation accuracy of the SOC of the lead-acid battery due to liquid reduction in the electrolyte solution.

(2) The above method for estimating the state of charge of the valve regulated lead-acid battery may further include a liquid reduction amount estimation step of estimating a liquid reduction amount of an electrolyte solution in the lead-acid battery based on the overcharge amount, in which in the state-of-charge estimation step, the state of charge of the lead-acid battery may be estimated by using the correlation between an open circuit voltage and state of charge with the rate of change according to the liquid reduction amount that is estimated. By the present method for estimating the state of charge of the valve regulated lead-acid battery, the SOC of the lead-acid battery can be estimated more accurately by using an appropriate OCV-SOC correlation based on the liquid reduction amount of the electrolyte solution estimated from the overcharge amount.

(3) In the method for estimating the state of charge of the valve regulated lead-acid battery, in the liquid reduction amount estimation step, with respect to a portion of the liquid reduction amount that is estimated, the portion being equal to or less than a predetermined value, a subtraction amount of the electrolyte solution may be estimated based on a first conversion relationship of the overcharged amount–the subtraction amount of the electrolyte solution, and with respect to a portion of the liquid reduction amount that has exceeded the predetermined value, the subtraction amount of the electrolyte solution may be estimated based on a second conversion relationship having a smaller conversion rate of the liquid reduction amount of the electrolyte solution with respect to the overcharge amount than the first conversion relationship.

Through repeated extensive studies, the present inventors have newly found that as liquid reduction in the electrolyte solution proceeds, gas absorption reaction at the negative electrode is more likely to occur, and liquid reduction due to the electrolysis of water is suppressed accordingly. This means that regardless of whether or not the liquid reduction amount of the electrolyte solution (overcharge amount) is equal to or larger than the predetermined value, when the common conversion relationship of the overcharge amount–the subtraction amount of the electrolyte solution is used, estimation accuracy of the subtraction amount of the electrolyte solution decreases, and consequently, estimation accuracy of the SOC of the lead-acid battery may decrease. On the other hand, according to the present method for estimating the state of charge of the valve regulated lead-acid battery, it is possible to suppress decrease in SOC estimation accuracy of the lead-acid battery due to the liquid reduction amount of the electrolyte solution.

(4) The method for estimating the state of charge of the valve regulated lead-acid battery may further include a temperature acquisition step of acquiring a temperature of the lead-acid battery, in which in the liquid reduction amount estimation step, the subtraction amount of the electrolyte solution is estimated based on a conversion relationship in which the conversion rate of the liquid reduction amount of the electrolyte solution with respect to the overcharge amount is smaller as the acquired temperature is lower. Through repeated extensive studies, the present inventors have newly found that in the valve regulated lead-acid battery, the conversion rate of the liquid reduction amount (hereinafter also referred to as "liquid reduction conversion rate") of the electrolyte solution with respect to the overcharge amount is smaller as the temperature of the lead-acid battery is lower. By the present method for estimating the state of charge of the valve regulated lead-acid battery, the liquid reduction amount of the electrolyte solution can be estimated more accurately because the subtraction amount of the electrolyte solution is estimated based on the conversion relationship in which the liquid reduction conversion rate is smaller as the temperature of the lead-acid battery is lower.

(5) A monitoring device for a valve regulated lead-acid battery according to an another aspect of the present invention includes an overcharge amount identification unit that identifies an overcharge amount when the lead-acid battery is overcharged after an arbitrary reference time, an open circuit voltage acquisition unit that acquires an open circuit voltage of the lead-acid battery after the reference time, and a state-of-charge estimation unit that estimates a state of charge of the lead-acid battery based on the acquired open circuit voltage and a correlation between an open circuit voltage and state of charge in which a rate of change of the state of charge with respect to the open circuit voltage is smaller as the overcharge amount from the reference time until an acquisition time of the open circuit voltage is larger.

(6) A method for estimating a liquid reduction amount of an electrolyte solution of a valve regulated lead-acid battery according to still another aspect of the present invention includes an overcharge amount identification step of identifying an overcharge amount when the lead-acid battery is overcharged, and a liquid reduction amount estimation step of estimating the liquid reduction amount of the electrolyte solution based on the overcharge amount. By the present estimation method, the liquid reduction amount of the electrolyte solution in the valve regulated lead-acid battery can be estimated.

(7) A method for estimating a sulfuric acid concentration of an electrolyte solution of a valve regulated lead-acid battery according to still another aspect of the present invention includes an overcharge amount identification step of identifying an overcharge amount when the lead-acid battery is overcharged, and a sulfuric acid concentration estimation step of estimating a sulfuric acid concentration of the electrolyte solution based on the overcharge amount. By the present estimation method, the sulfuric acid concentration of the electrolyte solution in the valve regulated lead-acid battery can be estimated.

A power storage system according to still another aspect of the invention includes a valve regulated lead-acid battery, an electric motor that operates by electric power from the lead-acid battery, a notification unit, and a battery monitoring unit. The battery monitoring unit performs: an overcharge amount identification step of identifying an overcharge amount when the lead-acid battery is overcharged after an arbitrary reference time; an open circuit voltage acquisition step of acquiring an open circuit voltage of the lead-acid battery after the reference time; and a state-of-charge estimation step of estimating a state of charge of the lead-acid battery based on the acquired open circuit voltage and a correlation between an open circuit voltage and state of charge in which a rate of change of the state of charge with respect to the open circuit voltage is smaller as the overcharge amount from the reference time until an acquisition time of the open circuit voltage is larger. The notification unit executes a notification operation according to a state of charge of the lead-acid battery estimated by the battery monitoring unit.

A power storage system according to still another aspect of the present invention includes a valve regulated lead-acid battery, an electric motor that operates by electric power from the lead-acid battery, a notification unit, and a battery monitoring unit. The battery monitoring unit performs; an overcharge amount identification step of identifying an overcharge amount when the lead-acid battery is overcharged; and an estimation step of estimating at least one of a liquid reduction amount of an electrolyte solution or a sulfuric acid concentration of the electrolyte solution based on the overcharge amount. The notification unit executes a notification operation according to an estimation result by the battery monitoring unit.

The technologies disclosed in the present specification can be achieved in various forms, for example, a monitoring device for a valve regulated lead-acid battery, a method for estimating at least one of a state of charge of the valve regulated lead-acid battery, a liquid reduction amount of an electrolyte solution, or a sulfuric acid concentration of the electrolyte solution, a computer program for implementing functions of the devices or method, a non-transitory recording medium on which the computer program is recorded, and the like.

A. Principles of Method for Estimating Liquid Reduction Amount of Electrolyte Solution in Valve Regulated Lead-Acid Battery Through repeated extensive studies, the present inventors have newly found that a correlation is established between the overcharge amount and the liquid reduction amount of the electrolyte solution in the valve regulated lead-acid battery (hereinafter also referred to as "VRLA"), and the liquid reduction amount of the electrolyte solution (or the sulfuric acid concentration of the electrolyte solution) can be estimated from the overcharge amount. The overcharge amount is the amount of electricity during overcharging in which a charge amount exceeds a discharge amount, and liquid reduction in the electrolyte solution means that water in the electrolyte solution in a housing of the lead-acid battery decreases. Details will be described below.

A-1. Correlation Between Overcharge Amount and Liquid Reduction Amount of Electrolyte Solution As described above, in the VRLA among lead-acid batteries, a correlation is established between the overcharge amount and the liquid reduction amount of the electrolyte solution.

First, a lead-acid battery generally includes a housing in which a housing space is formed, an electrode plate group housed in the storage space and having a positive electrode plate, a negative electrode plate, and a separator, and an electrolyte solution housed in the storage space (for example, dilute sulfuric acid). In such a lead-acid battery, for example, at an end of charging, water contained in the electrolyte solution may be electrolyzed in the housing space of the housing to generate oxygen gas from the positive electrode plate and hydrogen gas from the negative electrode plate. Therefore, in the case of the lead-acid battery, at least liquid reduction in the electrolyte solution occurs by electrolysis of water contained in the electrolyte solution.

In the VRLA, the liquid reduction in the electrolyte solution occurs mainly due to the electrolysis of water contained in the electrolyte solution. That is, in the VRLA, in a normal state where there is almost no electrolyte solution flowing in the housing space and pressure in the housing space is less than a predetermined value, the housing space of the housing is in a sealed state. Specifically, in the VRLA, the separator is formed by, for example, glass fiber, and the separator is impregnated with the electrolyte solution. Therefore, there is almost no electrolyte solution flowing in the housing space of the housing. Further, in the VRLA, a control valve is provided in the housing instead of an exhaust hole. In the normal state, the control valve is in a closed state so as not to discharge the gas generated in the housing space of the housing to outside of the housing, and the housing space is in a sealed state. Thus, in the VRLA, the liquid reduction in the electrolyte solution rarely occurs due to evaporation of water contained in the electrolyte solution, or the like.

The electrolysis of water contained in the electrolyte solution occurs as a side reaction of a charging reaction at a time of normal charge, and becomes a main reaction when the lead-acid battery is overcharged. The overcharge amount at this time is mainly used for electrolysis of contained water in the electrolyte solution. This means that a correlation is established between the overcharge amount and the liquid reduction amount of the electrolyte solution due to electrolysis of water.

As described above, in the VRLA, the liquid reduction in the electrolyte solution mainly occurs due to the electrolysis of water contained in the electrolyte solution, and a correlation is established between the liquid reduction amount of the electrolyte solution by the electrolysis of water and the overcharge amount. This means that in the VRLA, a correlation is established between the liquid reduction amount of the electrolyte solution and the overcharge amount. Therefore, in the VRLA, the liquid reduction amount of the electrolyte solution and moreover the sulfuric acid concentration of the electrolyte solution can be estimated from the overcharge amount. Note that because the VRLA has a small amount of electrolyte solution contained in the housing, even if the liquid reduction amount of the electrolyte solution (reduced amount of water contained in the electrolyte solution) is small, there is a large effect on the sulfuric acid concentration of the electrolyte solution in the housing. Therefore, in the VRLA, it is preferable to accurately estimate the liquid reduction amount of the electrolyte solution (sulfuric acid concentration of the electrolyte solution).

In a flooded-type lead-acid battery, no correlation is established between the liquid reduction amount of the electrolyte solution and the overcharge amount. That is, in the flooded-type lead-acid battery, an exhaust hole that is always open is formed in the housing, and oxygen gas and hydrogen gas (hereinafter collectively referred to as "gas") generated in the housing space of the housing can always be discharged to the outside of the housing. For this reason, in the flooded-type lead-acid battery, in addition to the electrolysis of water contained in the electrolyte solution, liquid reduction in the electrolyte solution occurs also due to evaporation of water contained in the electrolyte solution, or the like. Further, in the flooded-type lead-acid battery, because water in the electrolyte solution decreases by discharging gas, purified water is replenished in the housing space of the housing during the process of using the battery, and the amount of the electrolyte solution fluctuates. For these reasons, in the flooded-type lead-acid battery, a correlation is not established between the liquid reduction amount of the electrolyte solution and the overcharge amount.

A-2. Conversion Rate of Liquid Reduction Amount of Electrolyte Solution to Overcharge Amount As described above, in the VRLA, a correlation is established between the liquid reduction amount of the electrolyte solution and the overcharge amount. Therefore, by using a conversion rate according to this correlation (conversion rate of the liquid reduction amount of the electrolyte solution with respect to the overcharge amount, hereinafter also referred to as "liquid reduction conversion rate"), the liquid reduction amount of the electrolyte solution can be estimated from the overcharge amount. However, through repeated extensive studies, the present inventors have newly found that this liquid reduction conversion rate changes as the liquid reduction in the electrolyte solution proceeds.

In the VRLA, a gas absorption reaction may occur during charging, and this gas absorption reaction suppresses the liquid reduction amount of the electrolyte solution due to the electrolysis of water contained in the electrolyte solution. The gas absorption reaction is a reaction in which the negative electrode plate absorbs oxygen gas generated on the positive electrode plate by the electrolysis of water contained in the electrolyte solution during charging. At end of charging, the oxygen gas generated on the positive electrode plate reacts with lead, which is a negative electrode active material, to produce lead sulfate and water. That is, the water lost due to generation of oxygen gas on the positive electrode plate is regenerated. In addition, the negative electrode plate is in a discharge state due to generation of lead sulfate, and electrical energy of charging is used to reduce this lead sulfate, and thus the amount of hydrogen gas generated from the negative electrode plate also becomes smaller as compared with that of the flooded-type lead-acid battery. The gas absorption reaction occurs when the oxygen gas generated on the positive electrode plate comes into contact with a surface of the negative electrode plate that is exposed without being covered with the electrolyte solution (also referred to as "exposed surface of the negative electrode plate"). Therefore, the gas absorption reaction is unlikely to occur in an initial stage when the electrolyte solution remains sufficiently and there is almost no exposed surface of the negative electrode plate. On the other hand, the more the liquid reduction of the electrolyte solution proceeds and the exposed surface of the negative electrode plate become larger, the more likely the gas absorption reaction occurs. If the gas absorption reaction is likely to occur, the liquid reduction amount of the electrolyte solution per unit overcharge amount is reduced, and thus the liquid reduction conversion rate decreases.

Thus, by making a correction that decreases the liquid reduction conversion rate as the liquid reduction amount of the electrolyte solution increases, the liquid reduction amount of the electrolyte solution (sulfuric acid concentration of the electrolyte solution) can be more accurately estimated from the overcharge amount.

B. Embodiment

B-1. Configuration

FIG. 1 is an explanatory diagram schematically showing a configuration of a golf cart 60 according to the present embodiment. As shown in FIG. 1, the golf cart 60 includes a VRLA 100 as a battery, a drive motor 300 as an electric motor, a battery management unit (BMU) 400 for managing the state of the VRLA 100, and an operation unit 62. The golf cart 60 is a mobile object that travels by power of the drive motor 300 that is operated by power from the VRLA 100, and can travel on a predetermined road in a golf course by automatic driving.

The operation unit 62 is arranged near a steering wheel of the golf cart 60, for example. As shown enlarged in FIG. 1, the operation unit 62 is provided with a display unit 64 that includes, for example, a liquid crystal display or the like, and displays various images and information. The display unit 64 displays a display pattern 66 according to a charge state (state of charge (charge ratio), hereinafter also referred to as "SOC") of the VRLA 100. The SOC is the ratio (%) of the current capacity (remaining capacity) to the battery capacity of the VRLA 100 (rated capacity of the VRLA 100, maximum capacity that can be discharged, or capacity when being in a fully charged state). Specifically, "F" on a screen of the display unit 64 means that the VRLA 100 is in a fully charged state (for example, a state in which the voltage of the VRLA 100 is equal to or higher than a predetermined voltage upper limit value), and "E" on the screen of the display unit 64 means that the VRLA 100 is in an insufficient charge state (for example, a state in which the voltage of the VRLA 100 is equal to or less than a predetermined voltage lower limit value). A plurality of bars having different lengths on the screen of the display unit 64 is displayed in different patterns according to the SOC of the VRLA 100. For example, as the SOC of the VRLA 100 becomes lower and closer to an insufficient charge state, only the bar near "E" lights up, and as the SOC of the VRLA 100 becomes higher and closer to the fully charged state, from the bar near "E" to the bar near "F" light up.

Thus, the user of the golf cart 60 can intuitively grasp the remaining battery level of the VRLA 100 by looking at the display pattern 66 displayed on the display unit 64. The VRLA 100 provided in the golf cart 60 can be charged by a charger that is not shown. Thus, if the user of the golf cart 60 looks at the display pattern 66 displayed on the display unit 64 and determines that the VRLA 100 is approaching the insufficient charge state, the user can charge the VRLA 100 by the charger. A mobile object that requires frequent charging like the golf cart 60 requires high accuracy particularly in estimation of the SOC. Further, since the VRLA 100 is heavier than other secondary batteries, it is often mounted on a mobile object like the golf cart 60 for stable running. The BMU 400 corresponds to a monitoring device in the claims.

Figure 2:
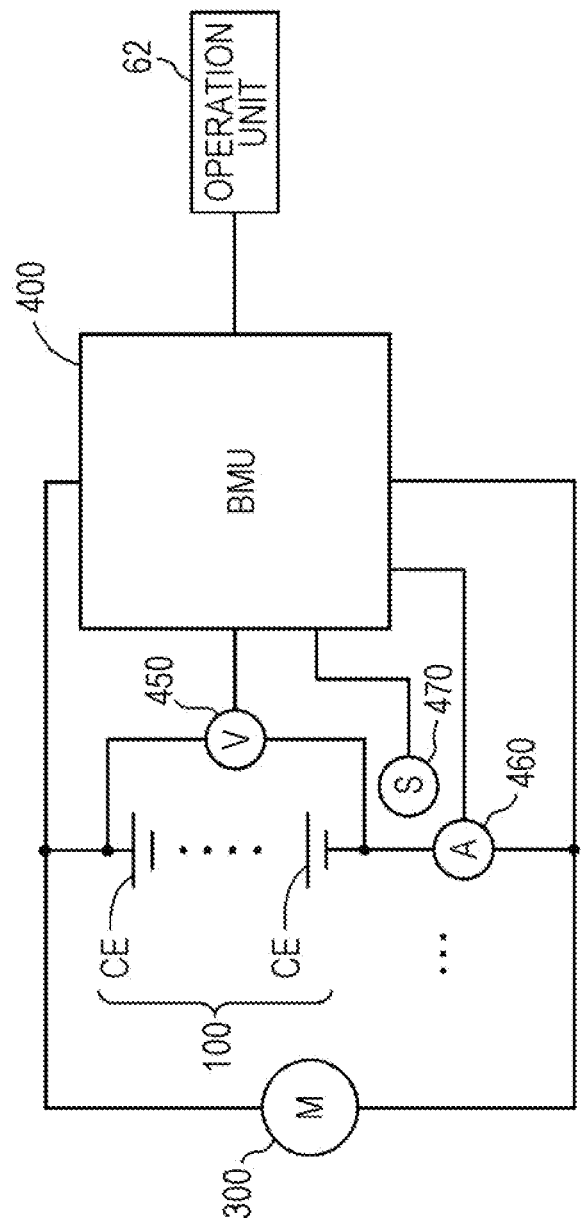
FIG. 2 is an explanatory diagram schematically showing an electrical configuration of the golf cart 60.

FIG. 2 is an explanatory diagram schematically showing an electrical configuration of the golf cart 60. As shown in FIG. 2, the golf cart 60 includes a voltage detection unit 450, a current detection unit 460, and a temperature detection unit 470 in addition to the VRLA 100, the drive motor 300, and the BMU 400 described above. The VRLA 100 is an assembled battery in which a plurality of cell CEs is connected in series.

(Configuration of Each Detector)

The voltage detection unit 450 is connected in parallel to the VRLA 100, and outputs a detection result according to the overall voltage value of the VRLA 100. The current detection unit 460 is connected in series with the VRLA 100, and outputs a detection result according to a current (charge-discharge current) value flowing through the VRLA 100. The temperature detection unit 470 is arranged near the VRLA 100 and outputs a detection result according to a temperature of the VRLA 100.

(Configuration of BMU 400)

Figure 3:
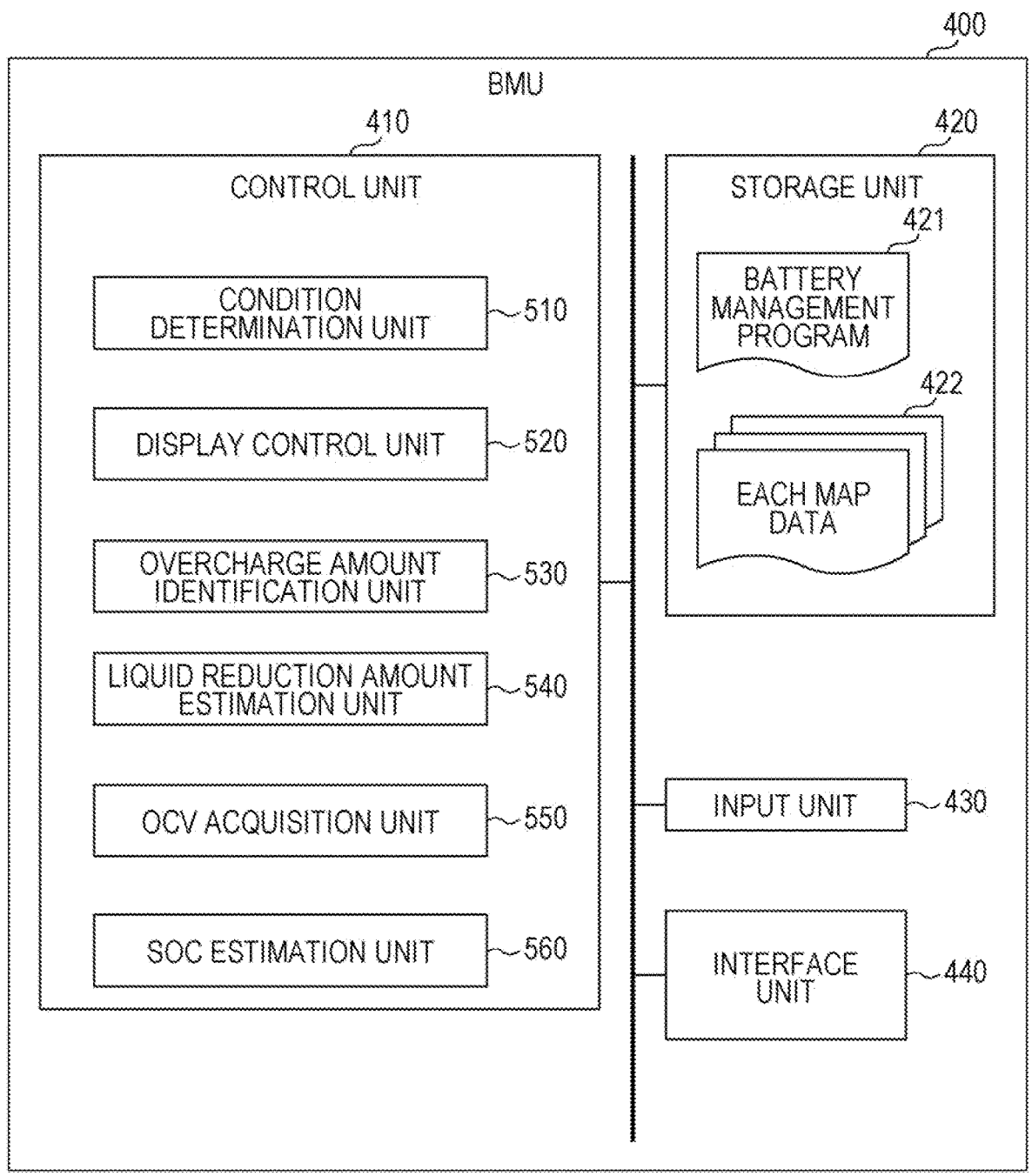
FIG. 3 is an explanatory diagram schematically showing a configuration of a battery management unit (BMU) 400.

FIG. 3 is an explanatory diagram schematically showing a configuration of the BMU 400. The BMU 400 includes a control unit 410, a storage unit 420, an input unit 430, and an interface unit 440. These units are communicably connected to each other via a bus.

The input unit 430 receives an input of a detection result from each of the voltage detection unit 450, the current detection unit 460, and the temperature detection unit 470. The interface unit 440 includes, for example, a LAN interface, a USB interface, or the like, and communicates with another device (for example, the operation unit 62) by wire or wirelessly.

The storage unit 420 includes, for example, a hard disk drive (HDD) or the like, and stores various programs and data. For example, the storage unit 420 stores a battery management program 421 for executing a battery management process described later. The battery management program 421 is provided, for example, in a state of being stored in a computer-readable recording medium (not shown) such as a CD-ROM, a DVD-ROM, or a USB memory, and is stored in the storage unit 420 by being installed in the BMU 400. Further, each map data 422 described later is stored in the storage unit 420. Each map data 422 is input to the BMU 400 via the interface unit 440 and stored in the storage unit 420.

The control unit 410 includes, for example, a CPU, a ROM, a RAM, and the like, and controls operation of the BMU 400 by executing a computer program read from the storage unit 420. For example, the control unit 410 functions as a processing unit that executes the battery management process described later by reading and executing the battery management program 421. Specifically, the control unit 410 includes a condition determination unit 510, a display control unit 520, an overcharge amount identification unit 530, a liquid reduction amount estimation unit 540, an open circuit voltage (open-circuit voltage, hereinafter also referred to as "OCV") acquisition unit 550, and an SOC estimation unit 560. The functions of each of these parts will be described later in description of the battery management process.

When the VRLA 100 is discharged, a load (not shown) is connected to the VRLA 100, and a reaction on the positive electrode plate of the VRLA 100 (reaction in which lead sulfate is generated from lead dioxide) and power generated by a reaction on the negative electrode plate (reaction in which lead sulfate is generated from lead (spear-like lead)) is supplied to the load. Further, when charging the VRLA 100, a power supply (not shown) is connected to the VRLA 100, and power supplied from the power supply causes a reaction on the positive electrode plate (reaction in which lead dioxide is generated from lead sulfate) and a reaction on the negative electrode plate (reaction in which lead (spine-like lead) is generated from lead sulfate) occurs and the VRLA 100 is charged.

B-2. Battery Management Process

Next, a battery management process executed by the BMU 400 will be described. The battery management process is a process of estimating the SOC of the VRLA 100 and displaying display contents according to an estimated SOC on the display unit 64.

Figure 4:
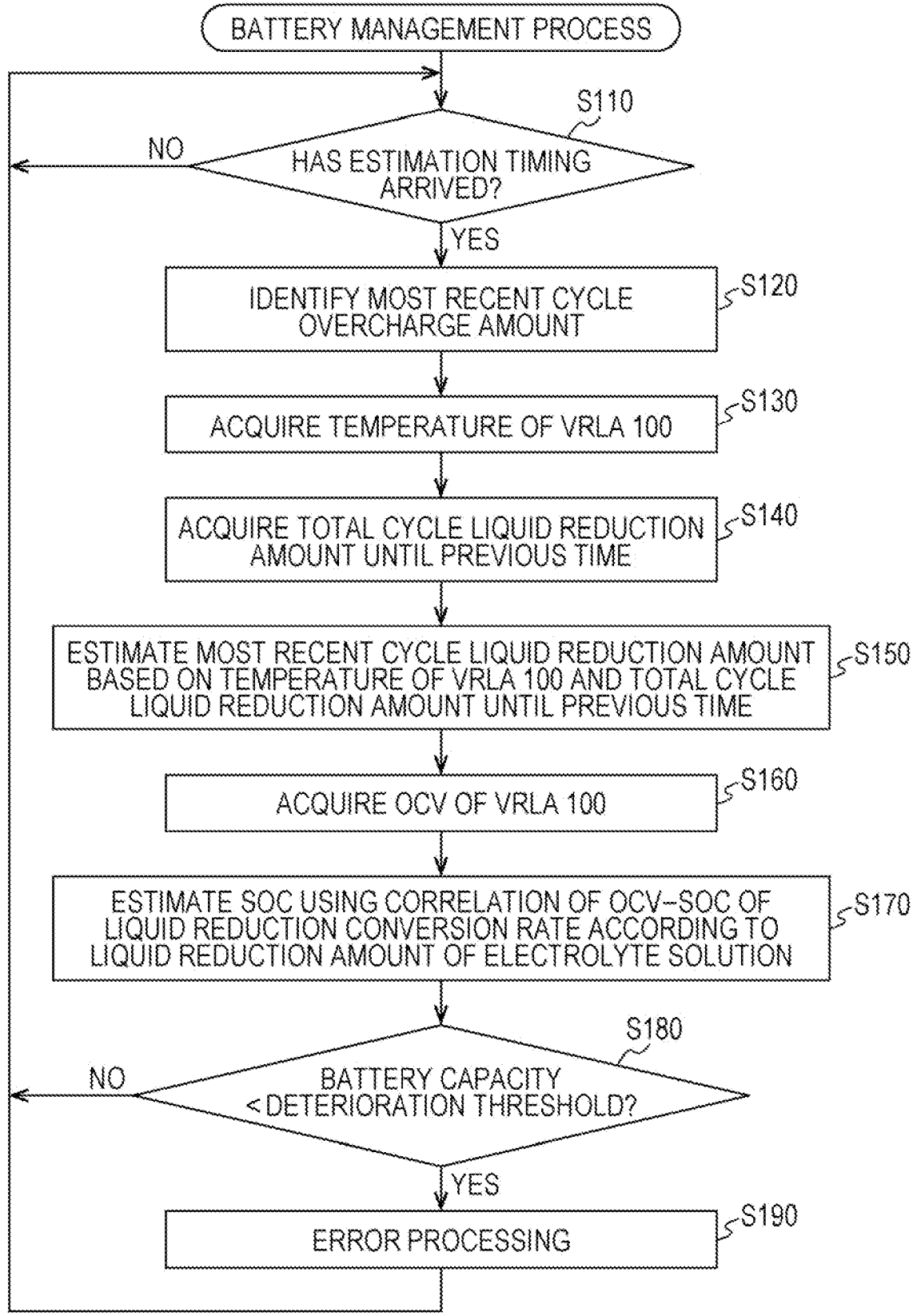
FIG. 4 is a flowchart showing a flow of a battery management process.

FIG. 4 is a flowchart showing a flow of the battery management process. First, the condition determination unit 510 determines whether or not an estimation timing for estimating the SOC of the VRLA 100 has arrived (S110). The condition determination unit 510 determines that an estimation timing has arrived on the condition that, for example, a predetermined time has elapsed from a time when the drive motor 300 of the golf cart 60 is stopped or a time when charging of the VRLA 100 by the charger is completed. The condition determination unit 510 can recognize that the drive motor 300 has stopped when it is determined that the current flowing through the VRLA 100 becomes equal to or less than a current lower limit value based on a detection result from the current detection unit 460. Further, the condition determination unit 510 can recognize that the VRLA 100 has been charged when it is determined that a voltage value of the VRLA 100 becomes equal to or higher than the voltage upper limit value described above based on a detection result from the voltage detection unit 450, or when the condition determination unit 510 receives a charge completion notification from the charger described above.

(Identification of Overcharge Amount)

When it is determined that the estimation timing has not arrived (NO in S110), the condition determination unit 510 repeats the determination of S110. When it is determined that the estimation timing has arrived (YES in S110), the overcharge amount identification unit 530 determines the overcharge amount in the most recent charge-discharge cycle of the VRLA 100 (hereinafter also referred to as "cycle overcharge amount (Ah)") (S120). The cycle overcharge amount is the charge amount during a period in which the VRLA 100 is overcharged in one charge-discharge cycle, and is a value obtained by subtracting the discharge amount from the charge amount in one charge-discharge cycle. The discharge amount is an integrated value of a discharge current amount flowing from the VRLA 100 when the VRLA 100 is discharged (in use), and the charge amount is an integrated value of a charge current amount flowing through the VRLA 100 when the VRLA 100 is charged. The overcharge amount identification unit 530 acquires the discharge amount and the charge amount based on the detection result from the current detection unit 460. Note that when the charge amount is equal to or less than the discharge amount in the charge-discharge cycle, the cycle overcharge amount is zero. Next, a specific example will be described.

Figure 5:
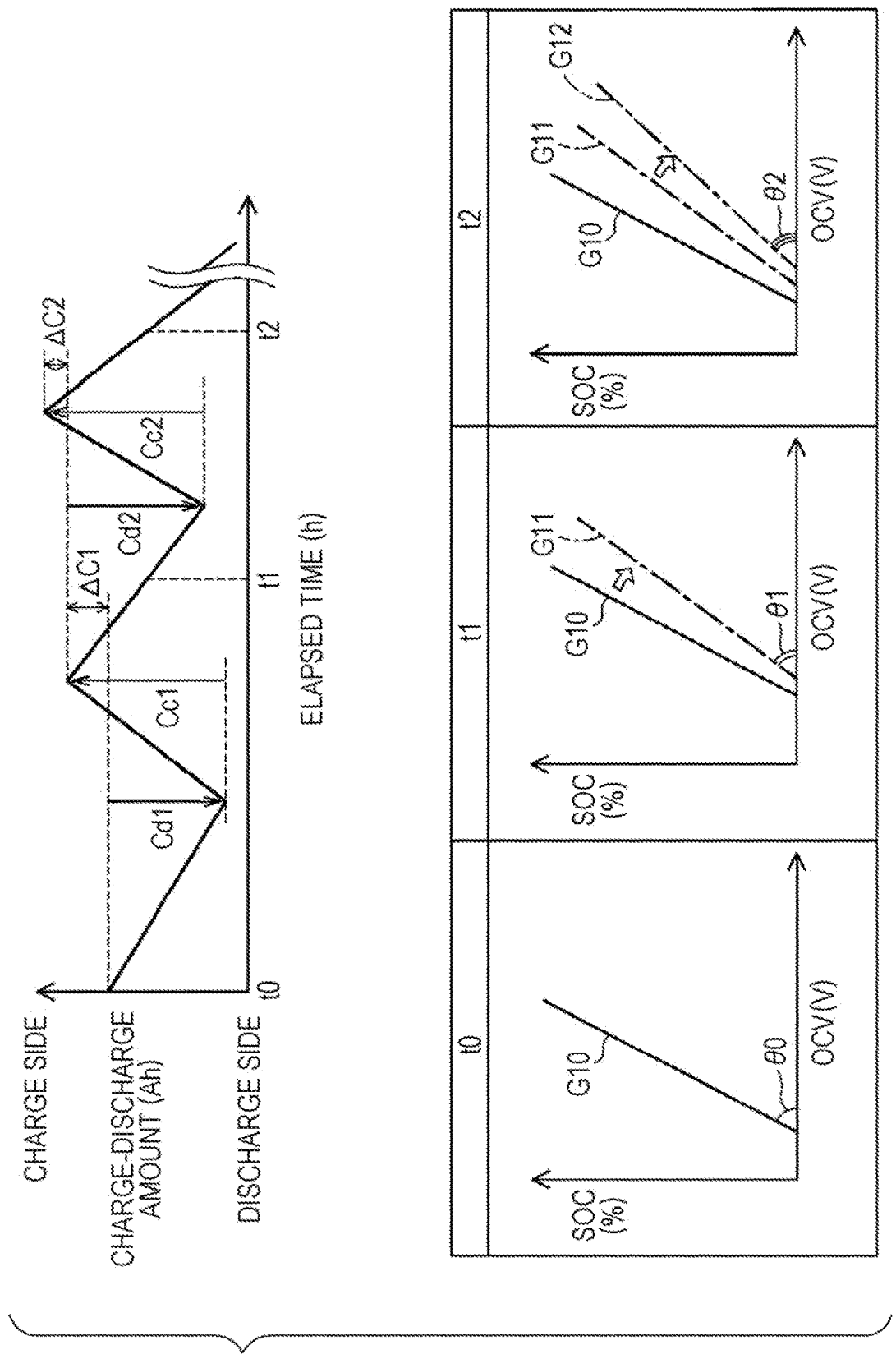
FIG. 5 is an explanatory diagram showing changes over time in a charge-discharge amount and a correlation between an open circuit voltage and state of charge of a valve regulated lead-acid battery (VRLA) 100.

FIG. 5 is an explanatory diagram showing changes over time in the charge-discharge amount and an OCV-SOC correlation of the VRLA 100. An upper part of FIG. 5 shows a charge-discharge graph schematically showing a change over time in the charge-discharge amount of the VRLA 100. A vertical axis of the charge-discharge graph is the charge-discharge amount (Ah) in the VRLA 100, and a horizontal axis is an elapsed time (h) from an initial timing t0. The charge-discharge graph shows a change in the charge-discharge amount of the VRLA 100 when the charge-discharge cycle of charging after discharging the VRLA 100 is repeated a plurality of times (only three times are exemplified in FIG. 5). For example, when the estimation timing is the first timing t1, the most recent cycle overcharge amount is a first cycle overcharge amount ΔC1 (=charge amount Cc1−discharge amount Cd1). When the estimation timing is a second timing t2, the most recent cycle overcharge amount is a second cycle overcharge amount ΔC2 (=charge amount Cc2−discharge amount Cd2). Note that the process of S120 is an example of an overcharge amount identification step in the claims.

(Estimation of Liquid Reduction Amount of Electrolyte Solution)

Next, the liquid reduction amount estimation unit 540 executes a liquid reduction amount estimation process of estimating the liquid reduction amount (g) of the electrolyte solution in the VRLA 100. Specifically, the liquid reduction amount estimation unit 540 estimates the liquid reduction amount of the electrolyte solution in the most recent charge-discharge cycle (hereinafter, also referred to as "cycle liquid reduction amount") by using the most recent cycle overcharge amount identified by the overcharge amount identification unit 530 and the overcharge amount-liquid reduction amount correlation. As described above, in the VRLA 100, a correlation is established between the liquid reduction amount of the electrolyte solution and the overcharge amount, and thus the cycle liquid reduction amount can be estimated from the cycle overcharge amount by using the liquid reduction conversion rate according to this correlation.

As described above, the liquid reduction conversion rate becomes smaller as the liquid reduction amount of the electrolyte solution increases. Moreover, the liquid reduction conversion rate becomes smaller as the temperature of the VRLA 100 is lower. Thus, in the present embodiment, the liquid reduction amount estimation unit 540 acquires the temperature of the VRLA 100 based on a detection result from the temperature detection unit 470 (S130). The liquid reduction amount estimation unit 540 reads out and acquires a total cycle liquid reduction amount until a previous time from the storage unit 420 (S140). The total cycle liquid reduction amount until a previous time is an integrated value of a liquid reduction amount from a state where the liquid reduction amount of the VRLA 100 is zero until a previous charge-discharge cycle. Then, the liquid reduction amount estimation unit 540 estimates the cycle liquid reduction amount from the cycle overcharge amount by using the corrected liquid reduction conversion rate (correlation between the liquid reduction amount of the electrolyte solution and the overcharge amount) according to the acquired temperature of the VRLA 100 and the total cycle liquid reduction amount until the previous time (S150). Next, this will be described in detail.

FIG. 6 is a graph showing the correlation between the overcharge amount and the liquid reduction amount. The vertical axis of FIG. 6 is the liquid reduction amount (g) of the electrolyte solution in the VRLA 100, and the horizontal axis is the overcharge amount (Ah) in the VRLA 100. FIG. 6 shows a first graph G21 when the temperature of the VRLA 100 is in a high temperature region (for example, a temperature region including 45° C.), a second graph G22 when the temperature of the VRLA 100 is in a medium temperature region (for example, the temperature region including 25° C.), and a third graph G23 when the temperature of the VRLA 100 is in a low temperature region (for example, a temperature region including 0° C.). As shown in FIG. 6, the liquid reduction conversion rate, which is a slope of the graph, decreases in the order of the first graph G21, the second graph G22, and the third graph G23. In FIG. 6, the liquid reduction amount of the electrolyte solution is divided into three stages of liquid reduction regions A to C, a first liquid reduction region A is a region in which the liquid reduced amount of the electrolyte solution is zero or more and less than a first liquid reduction amount V1, a second liquid reduction region B is a region in which the liquid reduction amount of the electrolyte solution reduced is equal to or more than the first liquid reduction amount V1 and less than a second liquid reduction amount V2, and a third liquid reduction region C is a region in which the liquid reduction amount of the electrolyte solution reduced is equal to or more than the second liquid reduction amount V2. As shown in FIG. 6, for each of the graphs G21 to 23, the liquid reduction conversion rate, which is the slope of the graph, decreases in the order of the first liquid reduction region A, the second liquid reduction region B, and the third liquid reduction region C. In the map data 422 stored in the storage unit 420, first map data (look-up table) showing the correlation between the overcharge amount and the liquid reduction amount shown in FIG. 6 is stored. The first map data can be acquired, for example, as follows. In each of the temperature ranges, while a charge-discharge cycle of discharging the VRLA 100 (for example, discharging 20 A for 2.4 hours) and then charging (charging 1.5 A for 35 hours) is repeated multiple times and the overcharge amount is measured in every charge-discharge cycle, the mass of the battery from the beginning is measured. The amount of decrease in the mass of the battery was defined as the liquid reduction amount of the electrolyte solution.

Based on an acquired temperature result of the VRLA 100, the liquid reduction amount estimation unit 540 determines which temperature region graph corresponds to the correlation between the overcharge amount and the liquid reduction amount of the first map data. The liquid reduction amount estimation unit 540 determines which of the first liquid reduction region A, the second liquid reduction region B, and the third liquid reduction region C the liquid reduction amount of the electrolyte solution corresponding to the most recent cycle overcharge amount belongs to based on the acquired total cycle liquid reduction amount until the previous time. For example, when the temperature of the VRLA 100 is 25° C., the liquid reduction amount estimation unit 540 determines to use the correlation between the overcharge amount and the liquid reduction amount corresponding to the second graph G22 of the medium temperature region in the first map data. When the total cycle liquid reduction amount until the previous time is equal to or less than the first liquid reduction amount V1, the liquid reduction amount estimation unit 540 extracts the liquid reduction amount of the electrolyte solution corresponding to the most recent cycle overcharge amount with reference to the correlation between the overcharge amount and the liquid reduction amount belonging to the first liquid reduction region A in the second graph G22, and takes the extracted liquid reduction amount as a most recent cycle liquid reduction amount. Then, the liquid reduction amount estimation unit 540 sets the total value of the total cycle liquid reduction amount until the previous time and the most recent cycle liquid reduction amount as the current total liquid reduction amount of the electrolyte solution.

When the current total liquid reduction amount of the electrolyte solution exceeds an upper limit value of the region to which the total cycle liquid reduction amount up to the previous time belongs, the liquid reduction amount of the electrolyte reduction is estimated using the correlation between the overcharge amount and the liquid reduction amount belonging to a region one level above the region to which the total cycle reduction amount up to the previous time belongs. For example, when the total cycle liquid reduction amount until the previous time belongs to the first liquid reduction region A and the current total liquid reduction amount of the electrolyte solution exceeds the first liquid reduction amount V1, for the excess amount, the liquid reduction amount of the electrolyte solution is estimated using the correlation between the overcharge amount and the liquid reduction amount belonging to the second liquid reduction region B. Consequently, the most recent cycle liquid reduction amount is the sum of the liquid reduction amount by the correlation between the overcharge amount and the liquid reduction amount belonging to the first liquid reduction region A and the liquid reduction amount by the correlation between the overcharge amount and the liquid reduction amount belonging to the second liquid reduction region B. Note that the calculated current total liquid reduction amount of the electrolyte solution is stored in the storage unit 420, and is used as the total cycle liquid reduction amount until the previous time in the next charge-discharge cycle. The process from S130 to S150 is an example of a liquid reduction amount estimation step in the claims.

(Acquisition of OCV)

The OCV acquisition unit 550 acquires the value of the OCV of the VRLA 100 (S160). The SOC estimation process is executed on the condition that the above-mentioned estimation timing has arrived (YES in S110). Thus, at this point, the predetermined time has already passed since the drive motor 300 of the golf cart 60 has stopped or the charging of the VRLA 100 has completed. In the present embodiment, assuming that this predetermined time is sufficient for measuring the OCV, the voltage value of the VRLA 100 at this moment is set to the value of the OCV based on a detection result from the voltage detection unit 450 when the SOC estimation process is executed. When a dark current flows through the VRLA 100 at a time when the drive motor 300 is stopped, or the like, it is preferable that the value obtained by a correction process performed on the voltage value of the VRLA 100 at this moment according to the amount of dark current is set as the OCV value. In addition to this, various known methods can be employed as the OCV acquisition method. The process of S160 is an example of an open circuit voltage acquisition step in the claims.

(Estimation of SOC)

Next, the SOC estimation unit 560 executes an SOC estimation process for estimating the SOC (%) of the VRLA 100. Specifically, the SOC of the VRLA 100 is estimated based on the OCV-SOC correlation in which the rate of change of the SOC with respect to the OCV is smaller as the overcharge amount from an arbitrary reference time until an acquisition time of the OCV is larger, and on the acquired OCV (S170). S170 is an example of a state-of-charge estimation step in the claims. Next, this will be described in detail.

Graphs G11 to G13 showing the OCV-SOC correlation at each timing in the lower part of FIG. 5. An initial timing graph G10 is a graph showing an OCV-SOC correlation of the VRLA 100 at the initial timing to, the first timing graph G11 is a graph showing the OCV-SOC correlation of the VRLA 100 at the first timing t1, and the second timing graph G12 is a graph showing the OCV-SOC correlation of the VRLA 100 at the second timing t2. As shown in the lower part of FIG. 5, the rate of change of the SOC with respect to the OCV, which is the slope of the graph ($\theta 0$ to $\theta 2$), decreases in the order of the initial timing graph G10, the first timing graph G11, and the second timing graph G12. The slope of each graph (rate of change in the SOC with respect to the OCV) correlates with the sulfuric acid concentration of the electrolyte solution in the VRLA 100, and the sulfuric acid concentration of the electrolyte solution correlates with the liquid reduction amount of the electrolyte solution in the VRLA 100. Then, as described above, in the VRLA 100, the liquid reduction amount of the electrolyte solution correlates with the overcharge amount. Therefore, the rate of change of the SOC with respect to the OCV can be corrected based on the overcharge amount. In the present embodiment, the SOC estimation unit 560 acquires the current total liquid reduction amount of the electrolyte solution stored in the storage unit 420, and for example, the rate of change of the SOC with respect to the OCV at the initial timing t0 is corrected to a small value according to the current total liquid reduction amount of the electrolyte solution. This correction value can be determined from the amount of the electrolyte solution at the initial timing t0, the sulfuric acid concentration, and the current total liquid reduction amount of the electrolyte solution. The SOC estimation unit 560 estimates the SOC from the OCV by using the OCV-SOC correlation of the rate of change of the SOC with respect to the OCV corrected according to the current total liquid reduction amount of the electrolyte solution.

The display control unit 520 determines whether or not the estimated SOC of the VRLA 100 is less than a deterioration threshold (S180). If it is determined that the VRLA 100 SOC is less than the deterioration threshold (YES in S180), error processing is performed (S190). Specifically, the display control unit 520 causes the display unit 64 to display an indication for prompting replacement of the VRLA 100. For example, in FIG. 1, a battery mark shown on the screen of the display unit 64 is blinked. After executing the error handling (S190), the process returns to S110. On the other hand, if it is determined that the SOC of the VRLA 100 is not less than the deterioration threshold (NO in S180), the error processing (S190) is skipped and the process returns to S110.

C. Modification Example

The technology disclosed in the present specification is not limited to the above-described embodiment, and can be modified into various forms without departing from the gist thereof, and the following modifications are possible, for example.

In the above embodiment, the golf cart 60 is exemplified as the power storage system, but the present invention is not limited to this, and for example, the power storage system may be a mobile object such as a go-kart that runs in an amusement park or a transport vehicle that runs in a factory may be used at a predetermined location, or may be a stationary arranged apparatus. In short, it is only necessary to be one provided with a valve regulated lead-acid battery.

In the above embodiment, the BMU 400 arranged outside the VRLA 100 is exemplified as the monitoring device, but the present invention is not limited to this. For example, the monitoring device may be a control unit provided in the VRLA 100, or may be a server or the like outside the mobile object, and the state of the VRLA 100 provided in the mobile object may be managed remotely.

In the above embodiment, the initial timing at which the liquid reduction amount of the electrolyte solution is zero and the initial timing of each charge-discharge cycle are exemplified as the arbitrary reference time, but other timings may be used. It is preferable that the accurate OCV-SOC correlation is grasped at the reference time. Further, in the above embodiment, the liquid reduction amount of the electrolyte solution is estimated based on the overcharge amount, and the SOC is estimated based on the estimated liquid reduction amount. However, the SOC may be directly estimated based on the overcharge amount.

In the above embodiment, the liquid reduction conversion rate is corrected according to the temperature of the VRLA 100 and the total cycle liquid reduction amount until the previous time, but the liquid reduction conversion rate may be corrected according to either the temperature of the VRLA 100 or the total cycle liquid reduction amount until the previous time, or the liquid reduction conversion rate may not be corrected. The order of the flow shown in FIG. 4 can be changed as appropriate. For example, acquisition of the OCV value of the VRLA 100 (S160) may be performed immediately before or immediately after identification of the overcharge amount (S120).

What is claimed is:

1. A method for estimating a state of charge of a valve regulated lead-acid battery, the method comprising:
    an overcharge amount identification step of identifying an overcharge amount when the lead-acid battery is overcharged after an arbitrary reference time, the overcharge amount being obtained by subtracting a discharge amount from a charge amount in one charge-discharge cycle;
    an open circuit voltage acquisition step of acquiring an open circuit voltage of the lead-acid battery after the reference time; and
    a state-of-charge estimation step of estimating a state of charge of the lead-acid battery based on the acquired open circuit voltage and a correlation between an open circuit voltage and state of charge in which a rate of change of the state of charge with respect to the open circuit voltage is corrected based on the overcharge amount such that the rate of change is smaller as the overcharge amount from the reference time until an acquisition time of the open circuit voltage is larger.

2. The method for estimating the state of charge of the valve regulated lead-acid battery according to claim 1, further comprising a liquid reduction amount estimation step of estimating a liquid reduction amount of an electrolyte solution in the lead-acid battery based on the overcharge amount,
    wherein in the state-of-charge estimation step, the state of charge of the lead-acid battery is estimated by using the correlation between the open circuit voltage and state of charge with the rate of change according to the liquid reduction amount that is estimated.

3. The method for estimating the state of charge of the valve regulated lead-acid battery according to claim 2, wherein in the liquid reduction amount estimation step, with respect to a portion of the liquid reduction amount that is estimated, the portion being equal to or less than a predetermined value, a subtraction amount of the electrolyte solution is estimated based on a first conversion relationship of the overcharged amount–the subtraction amount of the electrolyte solution, and with respect to a portion of the liquid reduction amount that has exceeded the predetermined value, the subtraction amount of the electrolyte solution is estimated based on a second conversion relationship having a smaller conversion rate of the liquid reduction amount of the electrolyte solution with respect to the overcharge amount than the first conversion relationship.

4. The method for estimating the state of charge of the valve regulated lead-acid battery according to claim 2, further comprising a temperature acquisition step of acquiring a temperature of the lead-acid battery,
    wherein in the liquid reduction amount estimation step, the subtraction amount of the electrolyte solution is estimated based on a conversion relationship in which the conversion rate of the liquid reduction amount of the electrolyte solution with respect to the overcharge amount is smaller as the acquired temperature is lower.

5. A monitoring device for a valve regulated lead-acid battery, the device comprising:
- an overcharge amount identification unit that identifies an overcharge amount when the lead-acid battery is overcharged after an arbitrary reference time, the overcharge amount being obtained by subtracting a discharge amount from a charge amount in one charge-discharge cycle;
- an open circuit voltage acquisition unit that acquires an open circuit voltage of the lead-acid battery after the reference time; and
- a state-of-charge estimation unit that estimates a state of charge of the lead-acid battery based on the acquired open circuit voltage and a correlation between an open circuit voltage and state of charge in which a rate of change of the state of charge with respect to the open circuit voltage is corrected based on the overcharge amount such that the rate of change is smaller as the overcharge amount from the reference time until an acquisition time of the open circuit voltage is larger.

6. A method for estimating a liquid reduction amount of an electrolyte solution of a valve regulated lead-acid battery, the method comprising:
- an overcharge amount identification step of identifying an overcharge amount when the lead-acid battery is overcharged, the overcharge amount being obtained by subtracting a discharge amount from a charge amount in one charge-discharge cycle; and
- a liquid reduction amount estimation step of estimating the liquid reduction amount of the electrolyte solution based on the overcharge amount.

7. The method for estimating the liquid reduction amount of the electrolyte solution of the valve regulated lead-acid battery according to claim 6, wherein in the liquid reduction amount estimation step, the liquid reduction amount of the electrolyte solution is estimated based on the overcharge amount and a correlation between an overcharge amount and a liquid reduction amount of the electrolyte.

* * * * *